United States Patent [19]

Hansen

[11] Patent Number: 4,528,490
[45] Date of Patent: Jul. 9, 1985

[54] TWO AXIS DRIVE FOR STAGE
[75] Inventor: Siegfried Hansen, Los Angeles, Calif.
[73] Assignee: Hughes Aircraft Company, El Segundo, Calif.
[21] Appl. No.: 407,024
[22] Filed: Aug. 11, 1982
[51] Int. Cl.³ .............................................. G05B 11/18
[52] U.S. Cl. ..................................... 318/560; 318/594
[58] Field of Search ............... 318/593, 594, 560, 601, 318/617

[56] References Cited
U.S. PATENT DOCUMENTS
4,223,257 9/1980 Miller .................................. 318/594

Primary Examiner—William M. Shoop
Assistant Examiner—Saul M. Bergmann
Attorney, Agent, or Firm—Anthony W. Karambelas

[57] ABSTRACT

Stage 12 is moved into position by traction of capstan 38 on bar 42 which is pivoted under intermediate plate 20, and by traction on bar 66 which is pivoted under stage plate 12. Bar 42 is pressed against motor driven capstan 38 by pressure rollers 44 and 46. The pressure rollers are mounted on a rotatable yoke 50 so that the bar can freely swing and only applies longitudinal forces to the plate. This same structure is provided for drive bar 66.

16 Claims, 5 Drawing Figures

TWO AXIS DRIVE FOR STAGE

The Government of the United States of America has rights in this invention pursuant to Contract Number DAAK 20-80-C-0262 awarded by the Department of Defense.

TECHNICAL FIELD

This invention is directed to the drive mechanism for positioning a work stage along two axes.

BACKGROUND OF THE INVENTION

The positioning of work stages must be accurate, and such accuracy requires rigidity in the drive structure. In addition, the small size of writing beams and the large areas to be exposed in modern semiconductor work require high response rates, which in turn requires mechanical rigidity. In a modern electron beam lithography system, a two axis stage is used for positioning a silicon wafer under an electron beam window. The silicon wafer is coated with a resist which will be selectively exposed in a desired pattern by writing of the electron beam and movement of the stage. A computer program controlling two motors connected to two stages suitably positions the stages. Typically the silicon wafer must move two millimeters to a new position in about 50 milliseconds. Accurate performance can be achieved with a servo control system which has a five millisecond response time. One limit on response time is set by the mechanical resonance resulting from elasticity between the servo motor and the stage. The frequency of this response should be 500 hertz or greater to achieve the desired response time.

Thus there is need for a stage drive mechanism which is rigidly connected to the stage for rapid and accurate response.

SUMMARY OF THE INVENTION

In order to aid in the understanding of this invention it can be stated in essentially summary form that it is directed to a drive for the two axes of a positionable stage. The drive includes, for each stage, a drive bar frictionally engaged against a drive capstan and held in place by a floating pressure roller so that the pressure roller can swing as the drive bar swings.

It is thus a purpose and advantage of this invention to provide a drive mechanism which provides for the positioning of a stage on two axes at an angle with respect to each other. It is a further purpose and advantage to provide a drive mechanism whereby each of the axes of the stage are separately driven, and each is driven by a drive mechanism of optimized rigidity so that high response rate drive of the stage is feasible.

Other purposes and advantages of this invention will become apparent from a study of the following portion of this specification, the claims and the attached drawings.

DETAILED DESCRIPTION OF THE INVENTION

Figure 1:
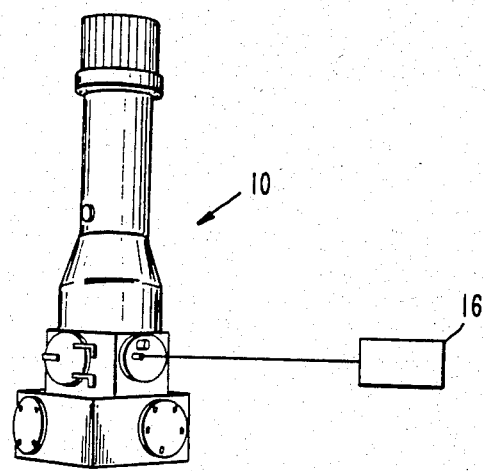
FIG. 1 is a perspective view of an electron beam column within which is incorporated the stage with its two axis drive in accordance with this invention.

FIG. 1 illustrates an electron or ion beam column 10 which has a source near the top and charged particle optics through the column. The optics include means for reducing the beam to a very small size and for deflecting the beam. The target within the column must be accurately positioned and regularly repositioned for treatment by the charged particle beam. Thus, a stage assembly 11 (see FIGS. 2 and 3) carries the target. Drive means 14 is connected to the stage assembly for driving it at an angle and positioning it with respect to the beam. Electronic control means 16 is connected to drive the stage assembly and control its position. The electronic control means 16 is preferably in the form of a computer having a program which establishes the desired position of the upper stage plate 12, receives information as to the present position of the upper stage plate 12 of the stage assembly and provides motor drive control to drive the stage assembly to the correct position.

Figure 2:
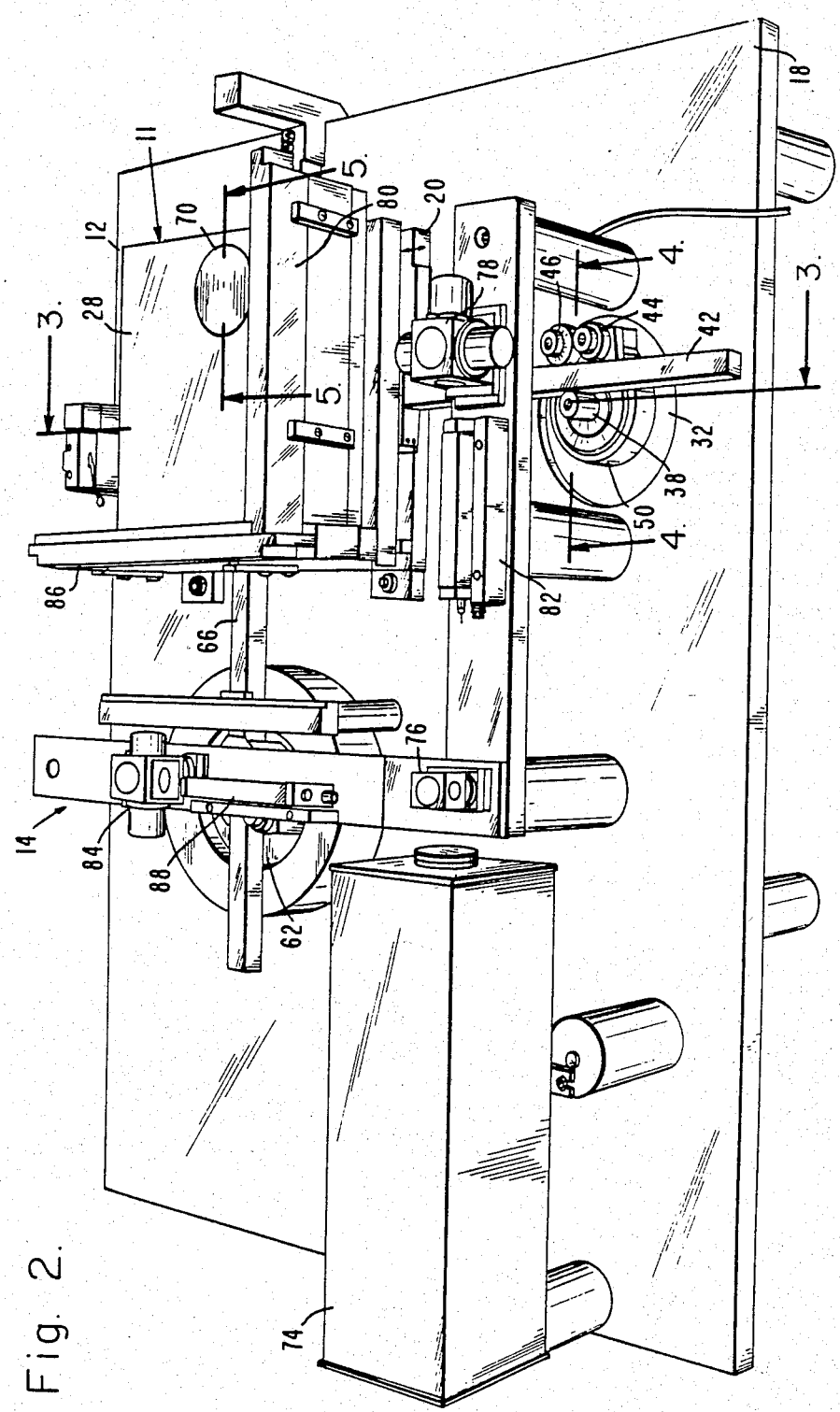
FIG. 2 is a perspective view from the front and top of the two axis stage with its drive in accordance with this invention.
Figure 3:
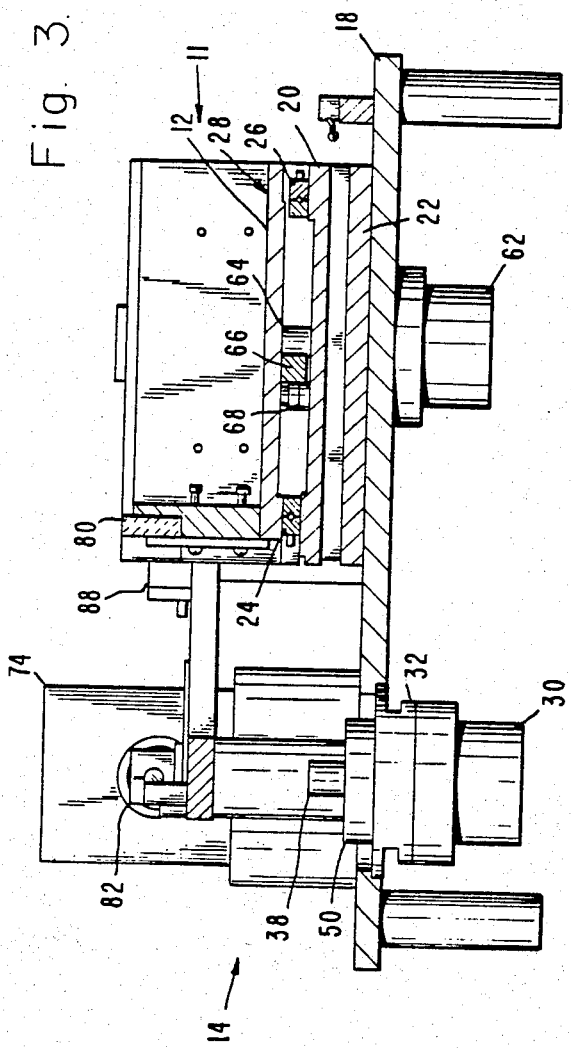
FIG. 3 is a section taken generally along line 3—3 of FIG. 2.

FIGS. 2 and 3 show the stage assembly 11 and the stage drive means in more detail. Base plate 18 is fixed within column 10 near the bottom thereof. Intermediate plate 20 is constrained to move in a linear direction with respect to base plate 18 by means of first and second spaced linear bearings positioned between base plate 18 and intermediate plate 20. One of the bearings is indicated at 22 in FIG. 3. It illustrates that the intermediate plate 20 is constrained to move left and right in FIG. 3. A similar pair of linear bearings 24 and 26 is illustrated in FIG. 3 as being positioned between intermediate plate 20 and upper stage plate 12. The bearings 24 and 26 constrain the stage plate 12 to move in the left and right direction of FIG. 2 with respect to intermediate plate 20. The linear bearings are preferably configured to move the stage plate 12 along an axis parallel to the direction of the linear bearings which are substantially at right angles with respect to each other, are substantially parallel to the upper face 28 of stage plate 12 on which the targets are mounted and is substantially normal to the beam path. Such orientation is superior for positioning of the stage and for treatment of the target by the beam.

Intermediate plate 20 and upper stage plate 12 are each driven by a separate drive mechanism. The two drive mechanisms are very similar, and the drive mechanism for the intermediate plate 20 is shown in more detail in FIG. 4. Motor 30 is mounted on flange 32 which is secured to the bottom of baseplate 18. Collar 34 extends upward from flange 32 and carries strong and heavy antifriction bearings 36 therein. Capstan 38 is driven by motor 30 and is supported by bearings 36. Seal 40 is positioned around the capstan within flange 32 so that the motor 30 may be in the non-vacuum space. There is vacuum above the baseplate 18 and around stage 12. Seal 40 may be a ferro-fluidic seal.

Figure 4:
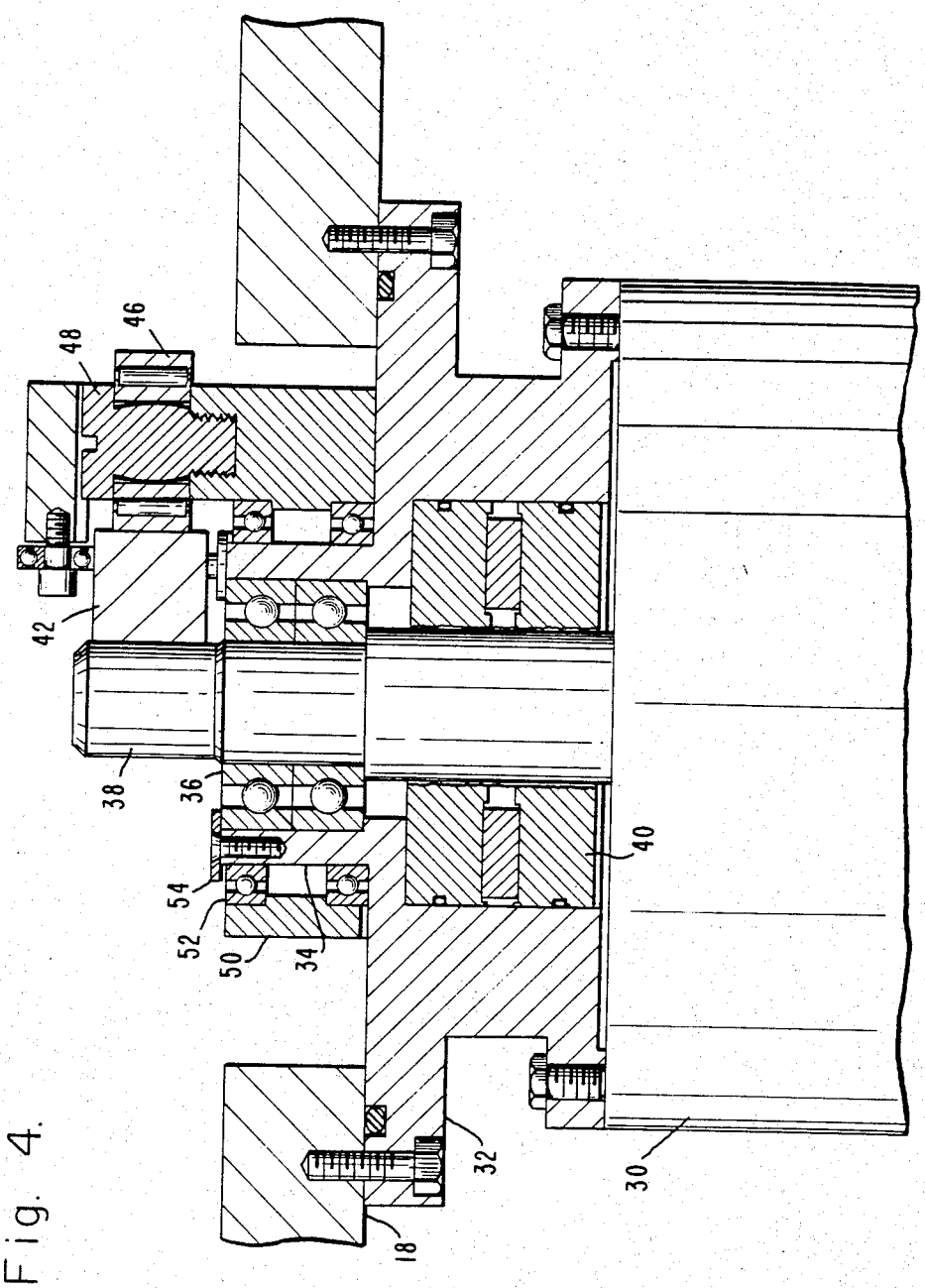
FIG. 4 is an enlarged section taken generally along line 4—4 of FIG. 2, with parts broken away, showing the capstan engagement with the drive bar, and the pressure roller mounting.

Drive bar 42 is engaged against the side of capstan 38. Pressure rollers 44 and 46 engage the side of the drive bar 42 opposite capstan 38 to apply the normal force which permits the capstan to apply traction forces along the length of drive bar 42. The mounting of pressure rollers 44 and 46 is the same. As seen in FIG. 4, pressure roller 46 is in the form of a needle type antifriction bearing mounted on pin 48 which is mounted on yoke 50. Pin 48 may be barrel shaped to permit tilting of bearing 46. Yoke 50 is in turn mounted upon antifriction bearings 52 which embrace the outer surface of collar 34. Annular cap 54 retains bearings 36 and 52 in place. The axis of rotation of yoke 50 coincides with the axis of rotation of capstan 38 so that the pressure rollers 44 and 46 can swing around the capstan. The yoke structure may be adjustable in roller radius position or may be dimensioned for inherent preload to provide heavy preloading of drive bar 42 against capstan 38, independent of the direction of drive bar 42 around the axis of the capstan. With this construction, the direction of motion of the intermediate plate on its linear bearings need not be exactly parallel to the direction of motion of the drive bar as driven by capstan 38.

Motor 30 is connected to be appropriately driven to move the intermediate stage plate 20 in the left and right direction in FIG. 3, with complete angular freedom of the direction of drive bar 42 in a plane normal to the capstan 38 and pin 56, which are substantially parallel to each other. In a similar way, motor 62 has a capstan 64 which is engaged against drive bar 66 by pressure rollers 68. The pressure rollers are mounted upon a rotatable yoke, the same as pressure rollers 44 and 46.

Figure 5:
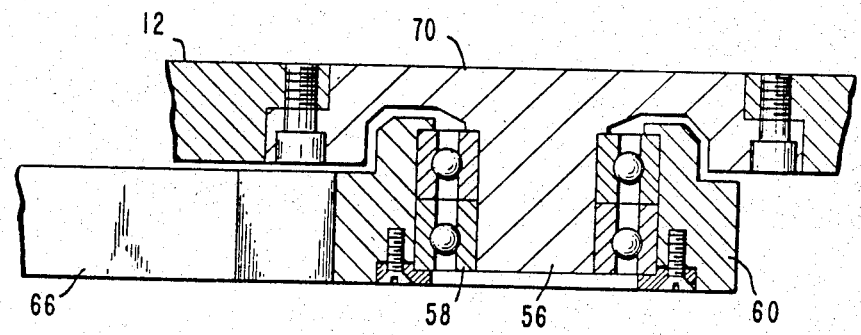
FIG. 5 is an enlarged section taken generally along line 5—5 of FIG. 2, with parts broken away.

The attachment of the other end of the drive bar 66 to the stage plate 12 is illustrated in FIG. 5. Pin 56 is secured to and extends downward from the bottom of insert 70, which is secured in an opening in upper stage plate 12. Bearings 58 embrace pin 56 and are constrained within yoke 60. Yoke 60 is secured to the end of drive bar 66. Bearings 58 are heavily preloaded to eliminate backlash and provide a stiff connection. It is thus seen that drive bar 66 does not impart torque forces to upper stage plate 12. It is thus seen that drive bar 66 has angular freedom of movement in a plane normal to the axis of capstan 64, because the drive end adjacent capstan 64 has such freedom and the yoke end under insert 70 has such freedom. It is particularly important to have this angular freedom for the drive bar 66 because its capstan end is referenced to the base plate 18 while its yoke end is referenced to the upper stage plate 12 which has freedom of motion in both directions defined by the linear bearings.

The opposite end of drive bar 42 is rotatably mounted on a downwardly extending pin under an insert in intermediate plate 20. A yoke containing bearings embraces a downwardly extending pin and the yoke is secured on the other end of intermediate drive bar 42. This is the same structure as shown in FIG. 5, except the insert is in the intermediate plate and the drive bar is the intermediate drive bar.

In view of the angular freedom of both the drive bars, it is desirable to directly reference the position of the upper stage plate 12 rather than employ the position of the drive bars to interpret the postion of the upper stage plate. Thus, an optical system is employed for determining position. Laser 74 emits a coherent beam of which approximately half passes straight through beam splitter 76 and fringe counter 82 to reflect on a mirror within mirror housing 78. That beam reflects off of mirror 80 which is mounted on stage plate 12 and reflects back into mirror housing 78 where it is directed to fringe counter 82. Fringe counter 82 counts the change in wavelength between the counter and mirror 80 so that the stage position can be accurately determined. The other portion of the beam which is reflected in beamsplitter 76 passes through fringe counter 88 and is reflected by mirror in housing 84 to reflect off of mirror 86 which is mounted on stage plate 12. The reflected beam from mirror 86 again is reflected by the mirror in mirror housing 84 and passes through fringe counter 88. By this portion of the structure the left and right position of stage plate 12, as seen in FIG. 2, is determined. This position information is fed back to the control means 16 so that the motors can be driven to position stage plate 12 in the location dictated by the command signal from the control means 16. Rigidity of the drive structure permits high frequency response.

The high speed response capability of each stage is derived in part from substantially matching the inertia of the drive motor to the inertia of its stage. Each motor is coupled to its stage by a drive ratio which substantially matches the motor inertia to the inertia of its load. The matching is preferably within about ten percent. In this way, the drive ratio is chosen so that the input energy of the motor is shared substantially equally between the kinetic energy of the motor and the kinetic energy of the stage.

This invention has been described in its presently contemplated best mode and it is clear that it is susceptible to numerous modifications, modes and embodiments within the ability of those skilled in the art without the exercise of the inventive faculty, accordingly, the scope of this invention is defined by the scope of the following claims.

What is claimed is:

1. A positioning stage comprising:
    a base;
    an intermediate plate, guide means engaged on said base and engaged on said intermediate plate for guiding said intermediate plate for motion on a path in a first direction;
    a stage plate, guide means engaging both said stage plate and said intermediate plate for moving said stage plate on a path in a second direction with respect to said intermediate plate;
    drive means on said base connected to said stage plate for moving said stage plate in its second direction, said drive means including a motor driven capstan, a drive bar pivotally mounted on said stage plate and frictionally engaged with said capstan so that rotation of said capstan moves said stage plate along its second path.

2. The stage of claim 1 wherein a roller engages said drive bar to force said drive bar against said capstan to provide traction by said capstan onto said drive bar.

3. The stage of claim 2 wherein said roller is pivoted upon a yoke which in turn is pivoted to rotate around said capstan on the axis of said capstan.

4. The stage of claim 3 wherein there are first and second rollers on said yoke, both of said first and second rollers being engaged upon said bar to force said bar into traction engagement with said capstan.

5. The stage of claim 4 wherein said drive bar is pivotally mounted on said stage plate.

6. The stage of claim 1 wherein said drive bar is pivotally mounted on said stage plate.

7. The stage of claim 1 further including a motor connected to drive said capstan and wherein the inertia of said motor is substantially equal to the inertia of said plate and drive means connected thereto.

8. A positioning stage comprising:

a base;

an intermediate plate, guide means engaged on said base and engaged on said intermediate plate for guiding said intermediate plate for motion on a path in a first direction;

drive means on said base connected to said intermediate plate for moving said intermediate plate in its first direction, said drive means including an intermediate drive capstan and an intermediate drive bar, said intermediate drive bar being connected to said intermediate plate and being in traction engagement with said intermediate capstan, an intermediate drive motor connected to rotate said intermediate capstan;

a stage plate, guide means engaging both said stage plate and said intermediate plate for moving said stage plate on a path in a second direction with respect to said intermediate plate;

drive means on said base connected to said stage plate for moving said stage plate in its second direction, said drive means including a motor driven stage drive capstan, a stage drive bar pivotally mounted on said stage plate and frictionally engaged with said capstan so that rotation of said capstan moves said stage plate along its second path.

9. The stage of claim 8 wherein said stage drive bar and said intermediate drive bar are each respectively pivotally mounted on said stage plate and on said intermediate plate.

10. The stage of claim 9 wherein said stage drive bar and said intermediate drive bar are respectively urged into traction engagement with said stage drive capstan and said intermediate drive capstan, respectively, by a stage press roller and an intermediate press roller.

11. The stage of claim 10 wherein respectively a stage yoke pivotally mounted around the axis of said stage capstan and said stage press roller is mounted on said yoke and there is an intermediate yoke pivotally mounted for rotation around the axis of said intermediate capstan and said intermediate press roller is mounted on said yoke.

12. The stage of claim 11 wherein there are two press rollers mounted on each of said yokes, both of said press rollers engaging said bar and urging it into traction engagement with said capstan.

13. The stage of claim 12 wherein mirrors are mounted on said stage plate and there is measuring means for measuring the position of said mirrors, said measuring means being connected to said motors for actuating said motors to position said stage at a predetermined position.

14. A positioning stage comprising:

a base;

an intermediate plate, guide means engaged on said base and engaged on said intermediate plate for guiding said intermediate plate for motion on a path in a first direction;

drive means on said base connected to said intermediate plate for moving said intermediate plate in its first direction, said intermediate plate drive means including an intermediate drive capstan and an intermediate drive bar, said intermediate drive bar being connected to said intermediate plate and being in traction engagement with said intermediate capstan, an intermediate drive motor connected to rotate said intermediate capstan, the inertia of said intermediate plate and said intermediate drive bar being substantially equal to the inertia of said intermediate drive motor;

a stage plate, guide means engaging both said stage plate and said intermediate plate for moving said stage plate on a path in a second direction with respect to said intermediate plate;

drive means on said base connected to said stage plate for moving said stage plate in its second direction, said drive means including a capstan and a drive bar pivotally mounted on said stage plate and frictionally engaged with said capstan so that rotation of said capstan moves said stage plate along its second path, a stage drive motor connected to drive said stage drive capstan, the inertia of said stage drive motor being substantially equal to the inertia of said stage plate and said stage drive bar.

15. The stage of claim 1 wherein mirrors are mounted on said stage plate and there is measuring means for measuring the position of said mirrors, said measuring means being connected to said motors for actuating said motors to position said stage at a predetermined position.

16. The stage of claim 8 wherein mirrors are mounted on said stage plate and there is measuring means for measuring the position of said mirrors, said measuring means being connected to said motors for actuating said motors to position said stage at a predetermined position.

* * * * *